United States Patent
Billington et al.

(10) Patent No.: US 6,482,749 B1
(45) Date of Patent: Nov. 19, 2002

(54) METHOD FOR ETCHING A WAFER EDGE USING A POTASSIUM-BASED CHEMICAL OXIDIZER IN THE PRESENCE OF HYDROFLUORIC ACID

(75) Inventors: Mitchell Stephen Billington, Vancouver, WA (US); Wesley T. Harrison, Wilsonville, OR (US); Yao Huei Huang, Vancouver, WA (US)

(73) Assignee: SEH America, Inc., Vancouver, WA (US)

(*) Notice: Subject to any disclaimer, the term of this patent is extended or adjusted under 35 U.S.C. 154(b) by 34 days.

(21) Appl. No.: 09/636,324

(22) Filed: Aug. 10, 2000

(51) Int. Cl.⁷ .............................................. H01L 21/302
(52) U.S. Cl. ....................................................... 438/745
(58) Field of Search ................................. 438/694, 703, 438/745

(56) References Cited

U.S. PATENT DOCUMENTS

| | | | |
|---|---|---|---|
| 4,294,651 A | | 10/1981 | Ohmura |
| 4,372,803 A | | 2/1983 | Gigante |
| 4,940,510 A | | 7/1990 | Burt |
| 5,233,218 A | * | 8/1993 | Miura .......................... 257/618 |
| 5,389,551 A | * | 2/1995 | Kamakura et al. ............. 437/10 |
| 5,426,073 A | * | 6/1995 | Imaoka et al. ............... 437/225 |
| 5,445,706 A | | 8/1995 | Okuno et al. |
| 5,449,532 A | * | 9/1995 | Toyokawa et al. ........... 427/255 |
| 5,622,875 A | * | 4/1997 | Lawrence .................... 438/691 |
| 5,893,982 A | | 4/1999 | Nakano et al. |
| 5,945,351 A | | 8/1999 | Mathuni |
| 6,033,997 A | * | 3/2000 | Perng .......................... 438/765 |
| 6,080,675 A | * | 6/2000 | Prall et al. ................... 438/694 |
| 6,099,748 A | * | 8/2000 | Netsu et al. .................... 216/99 |
| 6,150,969 A | * | 11/2000 | Iwamatsu et al. ............ 257/347 |
| 6,294,469 B1 | * | 9/2001 | Kulkarni et al. ............. 438/689 |
| 6,335,267 B1 | * | 1/2002 | Iwamatsu et al. ............ 438/479 |
| 2001/0014570 A1 | * | 8/2001 | Wenski et al. ................. 451/41 |
| 2001/0039101 A1 | * | 11/2001 | Wenski et al. ............... 438/471 |
| 2002/0004305 A1 | * | 1/2002 | Vasat et al. .................. 438/690 |

OTHER PUBLICATIONS

Wolf et al., Silicon Processing for the VLSI Era Vol. 1: Proecess Technology, Lattice Press, Sunset Beach, CA, USA, pp. 23–26, 60–72, 198–199, 219–220, 516–524, 529–534, 1986.*

(List continued on next page.)

*Primary Examiner*—Gregory Mills
*Assistant Examiner*—Matthew Anderson
(74) *Attorney, Agent, or Firm*—Alston & Bird LLP (57) ABSTRACT

A method for fabricating wafers is provided that uses a potassium-based oxidizer in the presence of hydrofluoric acid as the chemical etchant for etching the wafer edge. The potassium-based chemical etchant is preferably potassium permanganate $KMnO_4$ that is mixed with hydrofluoric acid such that the ratio of hydrofluoric acid to potassium permanganate is between 2:1 and 4:1. The method for fabricating wafers initially divides a crystal ingot into a plurality of wafers before grinding the wafer edge to size and shape the wafer. The wafer can then be subjected to alkaline cleaning and acid etching. After a polysilicon layer is deposited on the wafer for gettering purposes and a silicon dioxide back seal layer, if any, is deposited, the wafer is then etched with the potassium-based chemical oxidizer in the presence of hydrofluoric acid to oxidize and remove the polysilicon layer and any silicon dioxide layer from the edge. The wafer is then rinsed and thermally annealed prior to undergoing edge polishing. In order to concentrate the potassium-based chemical etchant on the wafer edge, the opposed major surfaces can be covered, such as by being stacked in an alternating fashion with spacers. As such, the wafer edge can be reliably formed in an efficient and safe manner.

19 Claims, 7 Drawing Sheets

OTHER PUBLICATIONS

Wolf et al., Silicon Processing for the VLSI Era vol. 1: Proecess Technology, Lattice Press, Sunset Beach, CA, USA, pp. 23–26, 219–220, 523–524, 529–533.*

D.G. Schimmel and M.J. Elkind, *An Examination of the Chemical Staining of Silicon*, J. Electrochem. Soc.: Solid-State Science and Technology, Jan. 1978, pp. 152–155, vol. 125, No. 1.

Web Pages, www.chapinst.com, Chapman Instruments, *Quality Control of Edge, Bevel and Notch Polishing*; About Surface Profiling: M3100 Non–Contact Surface Profiling System; Wafer Edge Measurements and Roll–off Measurements of Silicon Wafers, May 24, 2000.

* cited by examiner

METHOD FOR ETCHING A WAFER EDGE USING A POTASSIUM-BASED CHEMICAL OXIDIZER IN THE PRESENCE OF HYDROFLUORIC ACID

FIELD OF THE INVENTION

The present invention relates generally to methods for etching the edge of a wafer and, more particularly, to methods for etching the edge of a wafer using a potassium-based chemical oxidizer, such as potassium permanganate, in the presence of hydrofluoric (HF) acid.

BACKGROUND OF THE INVENTION

Figure 1A:
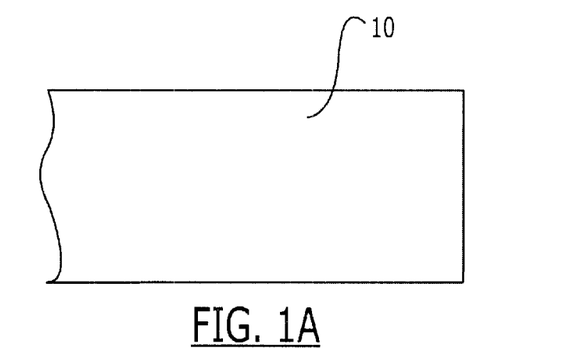
FIGS. 1A, 1B, 1C, 1D, 1E, 1F, 1G, 1H, 1I are sequential schematic views of a wafer edge as the wafer undergoes conventional wafer fabrication processes.

Wafers 10, such as silicon wafers, that form the substrate upon which semiconductor devices are formed must be made to exact specifications and must be generally free of manufacturing defects. During a typical wafer fabrication process, wafers are sliced from an ingot. The resulting wafers have relatively rough, but square edges as depicted in FIG. 1A. Thereafter, the wafer edge is ground to size the wafer to an exact diameter and to form the edges into a preferred geometric shape. In this regard, the edge is generally ground to define chamfered portions proximate each of the opposed major surfaces. See FIG. 1B. This grinding process, however, can create imperfections in the wafer (depicted schematilcally as pits 12 in FIG. 1) which, in the ensuing machining processes, can cause problems, such as by leading to mounding or crowning of a subsequently deposited epitaxial layer, as described in detail hereinbelow.

Following grinding of the wafer edge, the wafer 10 is typically cleaned in an alkaline solution and, in many instances, is then subjected to an acid etching treatment. See FIGS. 1C and 1D. The alkaline cleaning will tend to preferentially etch the wafer edge and, as such, may actually enlarge the imperfections created by the grinding process. While the acid etching may somewhat decrease the roughness of the wafer edge, the acid etching typically does not completely counteract or offset the effects of the alkaline cleaning.

Typically, wafers 10 are processed to establish gettering sites on the backside of the wafer. As known to those skilled in the art, the gettering sites attract bulk impurities, such as transition metals, away from the front surface of the wafer upon which semiconductor devices are typically formed. One technique for creating gettering sites on the backside of a wafer is to sandblast or otherwise roughen the back surface of the wafer. However, another common technique for establishing gettering sites on the backside of a wafer is to deposit a polysilicon layer 14 on the wafer, typically by means of a low pressure chemical vapor deposition (LPCVD) process. The polysilicon layer is subsequently removed, such as by polishing, from the front surface of the wafer, but remains on the back surface of the wafer in order to serve as gettering sites for bulk impurities within the wafer. Unfortunately, in depositing the polysilicon layer on the wafer, the polysilicon layer is also deposited on the wafer edge and within the imperfections in the wafer edge as shown in FIG. 1E.

Figure 1B:
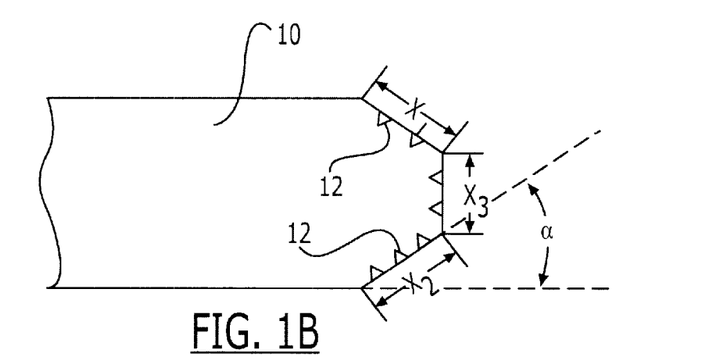
Figure 1C:
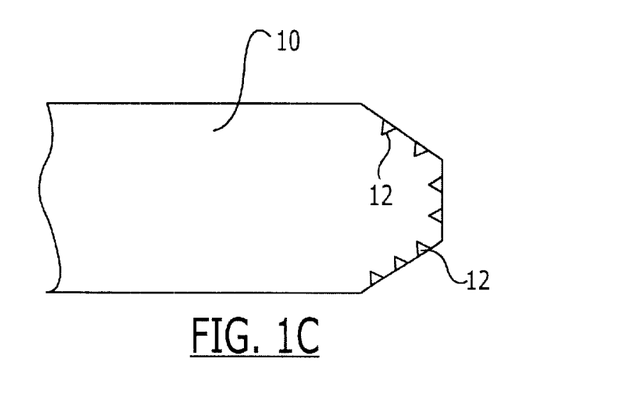
Figure 1D:
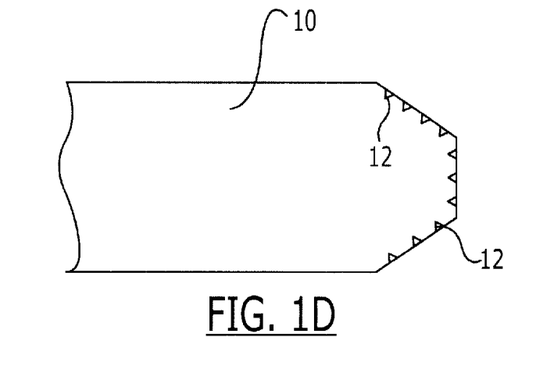
Figure 1E:
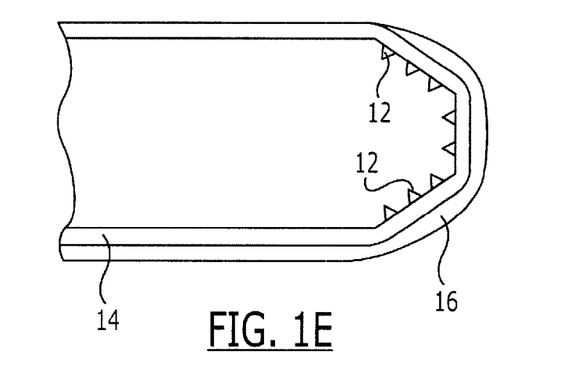
Figure 1F:
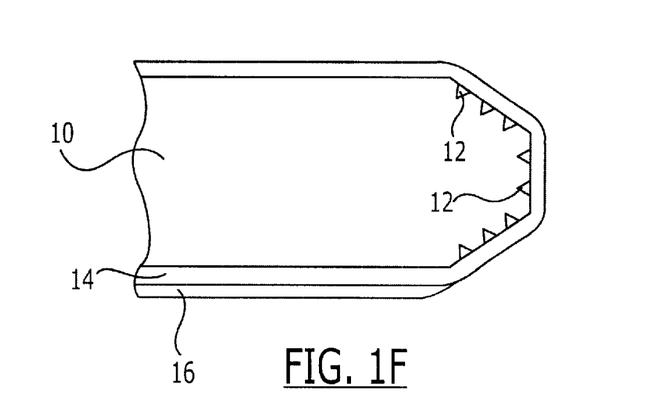

As also shown in FIG. 1E, a silicon dioxide ($SiO_2$) layer 16 is also oftentimes deposited on the back surface of the wafer 10 in order to create a back seal to prevent autodoping during subsequent processing of the wafer, thereby preventing dopants from escaping through the back surface of the wafer and being disadvantageously redeposited upon the front surface of the wafer. In particular, an $SiO_2$ layer is typically deposited on the back surface of those wafers that will subsequently undergo an epitaxial deposition process as described hereinafter. Typically, the $SiO_2$ layer is deposited by chemical vapor deposition (CVD) process. As a result, $SiO_2$ layer is deposited not only on the back surface of the wafer, but also upon the wafer edge as shown in FIG. 1E. In order to remove the $SiO_2$ from the wafer edge, the wafer is typically cleaned and the wafer edge is then etched with HF acid. While the HF acid removes the $SiO_2$, the HF acid does not remove the polysilicon layer 14 that was previously deposited upon the wafer. As such, the wafer edge is still coated with polysilicon following the HF acid etching. See FIG. 1F.

Following the HF etching process, the wafers are then rinsed and inspected. Following inspection, the edges are subjected to chemical mechanical polishing (CMP), typically by means of an edge polishing machine, such that the resulting edge surfaces have a smooth mirror-like finish that resists the subsequent adhesion of contaminants.

Figure 1G:
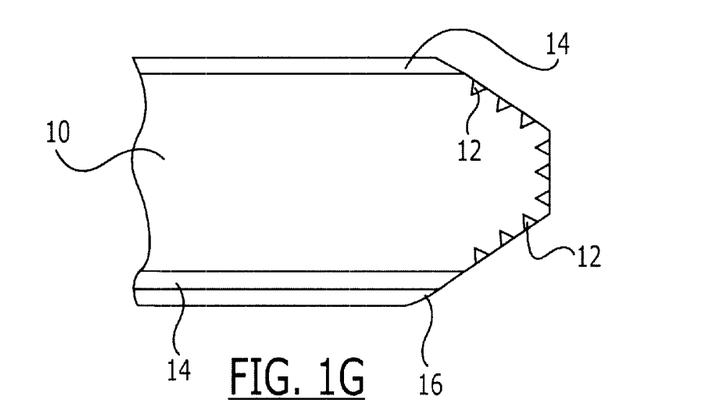

See FIG. 1G. As known to those skilled in the art, edge polishing commonly utilizes a slurry which provides the abrasive for the polishing process. Since the wafer edges are still coated with polysilicon, however, the polishing process takes a substantial length of time in order to remove the polysilicon layer 14 and expose the bare silicon. As a result, the throughput of the wafer fabrication process may be slowed somewhat by the length of time required to remove the polysilicon layer during the polishing of the wafer edge. Additionally, even once the wafer edge has been polished so as to remove the polysilicon layer, polysilicon will remain in any imperfections 12 not removed from the wafer edge. Any polysilicon that remains on the contoured edge at an acute angle from the plane of the wafer's front surface has the potential to act as an initiating site for a failure phenomena resulting from epitaxial deposition upon the site that is commonly referred to as a nodule. Effective removal of the polysilicon results in fewer initiating sites where nodules often form during subsequent epitaxial deposition as described below.

Figure 1H:
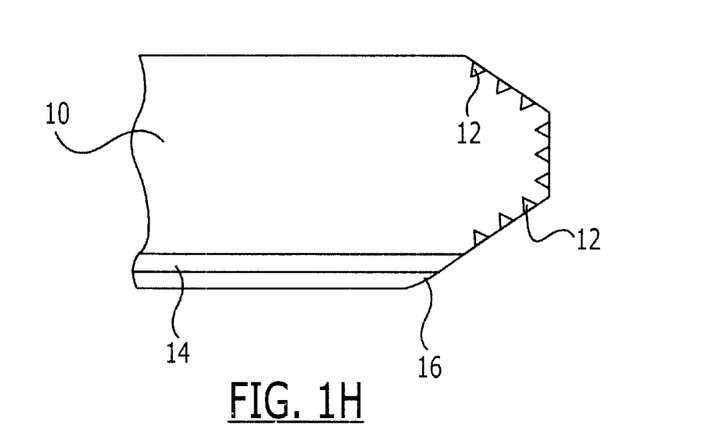

Once the wafer edge has been ground, etched, and polished, as described above, the front surface of the wafer 10 can be polished, usually by means of a polishing machine that sequentially employs slurry having particulates of decreasing sizes in order to finely polish the front surface. See FIG. 1H. While the polishing of the front surface of the wafer can complete the wafer fabrication process, some semiconductor device manufacturers desire for an epitaxial layer to be deposited upon the front surface.

Figure 1I:
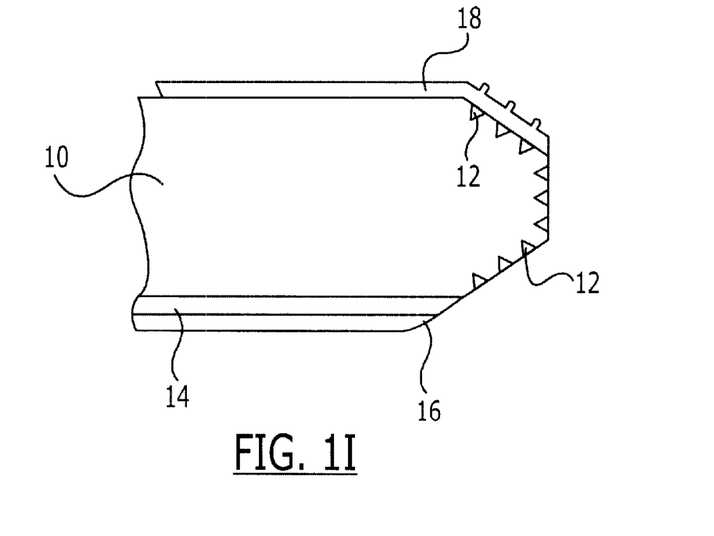

During the deposition of an epitaxial layer 18 upon the front surface of the wafer 10, the epitaxial layer will build upon and continue the crystal orientation, or lack thereof, of the polysilicon in the form of nodules on the wafer edges. Since the polysilicon pre-nodule sites have an indeterminate crystal orientation, an epitaxial layer deposited upon this site will also have an indeterminate crystal orientation, thereby rendering that portion of the wafer unfit for the fabrication of most semiconductor devices due to the resulting irregular surface texture near the edge region on the front side of the wafer. Moreover, the edge region of the epitaxial layer will tend to mound or crown as depicted in FIG. 1I, thereby preventing the epitaxial layer from having a flat surface, as desired. To date, however, it has proven difficult to remove the polysilicon from the imperfections prior to growing the epitaxial layer on the front surface of the wafer.

SUMMARY OF THE INVENTION

The present invention relates to a method for fabricating a wafer that grinds the edge of the wafer to size the wafer and to shape the wafer edge and, following the deposition of a polysilicon layer on the wafer, etches the wafer edge with a potassium-based chemical oxidizer, such as potassium permanganate, in the presence of HF acid in order to remove polysilicon from and otherwise reduce the roughness of the wafer edge. The edge of the wafer is then polished in a more efficient manner and for a shorter length of time than conventional edge polishing techniques since the polysilicon layer has already been removed and the corresponding roughness of the wafer edge has been reduced in advance of the edge polishing.

The edge of the wafer is typically etched with a potassium-based chemical oxidizer in the presence of HF acid at a removal rate of between 1.5 microns/minute and 4 microns/minute. For these removal rates, the etchant typically has a ratio of HF acid to potassium-based chemical oxidizer of between 2:1 and 4:1. Not only does the potassium-based chemical oxidizer in the presence of HF acid remove polysilicon from the wafer edge, but the potassium-based chemical oxidizer in the presence of HF acid also removes any silicon dioxide that has been deposited upon the wafer edge. Further, the potassium-based chemical oxidizer in the presence of HF acid also cleans or etches the outermost surface of the bare silicon in order to reduce the roughness of the wafer edge.

The method of the present invention also contemplates covering the opposed major surfaces of the wafer while exposing the wafer edge to the potassium-based chemical oxidizer in the presence of HF acid. As such, the potassium-based chemical oxidizer and the HF acid will only etch the exposed edge and not the opposed major surfaces of the wafer. In one embodiment, for example, a plurality of wafers are stacked such that the major surface of one wafer faces a major surface of an adjacent wafer. By sandwiching the wafers about a spacer, such as a Teflon™ spacer, the opposed major surfaces are therefore protected from the etchant.

According to the present invention, the method controllably etches the edge of a wafer with a potassium-based chemical oxidizer in the presence of HF acid to remove polysilicon, including polysilicon pre-nodule sites, from the wafer edge, thereby eliminating the initiating site for nodule formation on any subsequently deposited epitaxial layer and enhancing wafer edge smoothness for all wafers, both wafers having an epitaxial layer and wafers without an epitaxial layer. By removing the polysilicon from and reducing the roughness of the wafer edge, the edge can also be polished more quickly and efficiently, thereby potentially increasing the throughput of the wafer fabrication process.

BRIEF DESCRIPTION OF THE DRAWINGS

The above and other objects, features, and advantages of the invention will become more apparent from the following description of certain preferred embodiments thereof, when taken in conjunction with the accompanying drawings in which.

DETAILED DESCRIPTION OF THE INVENTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 2:
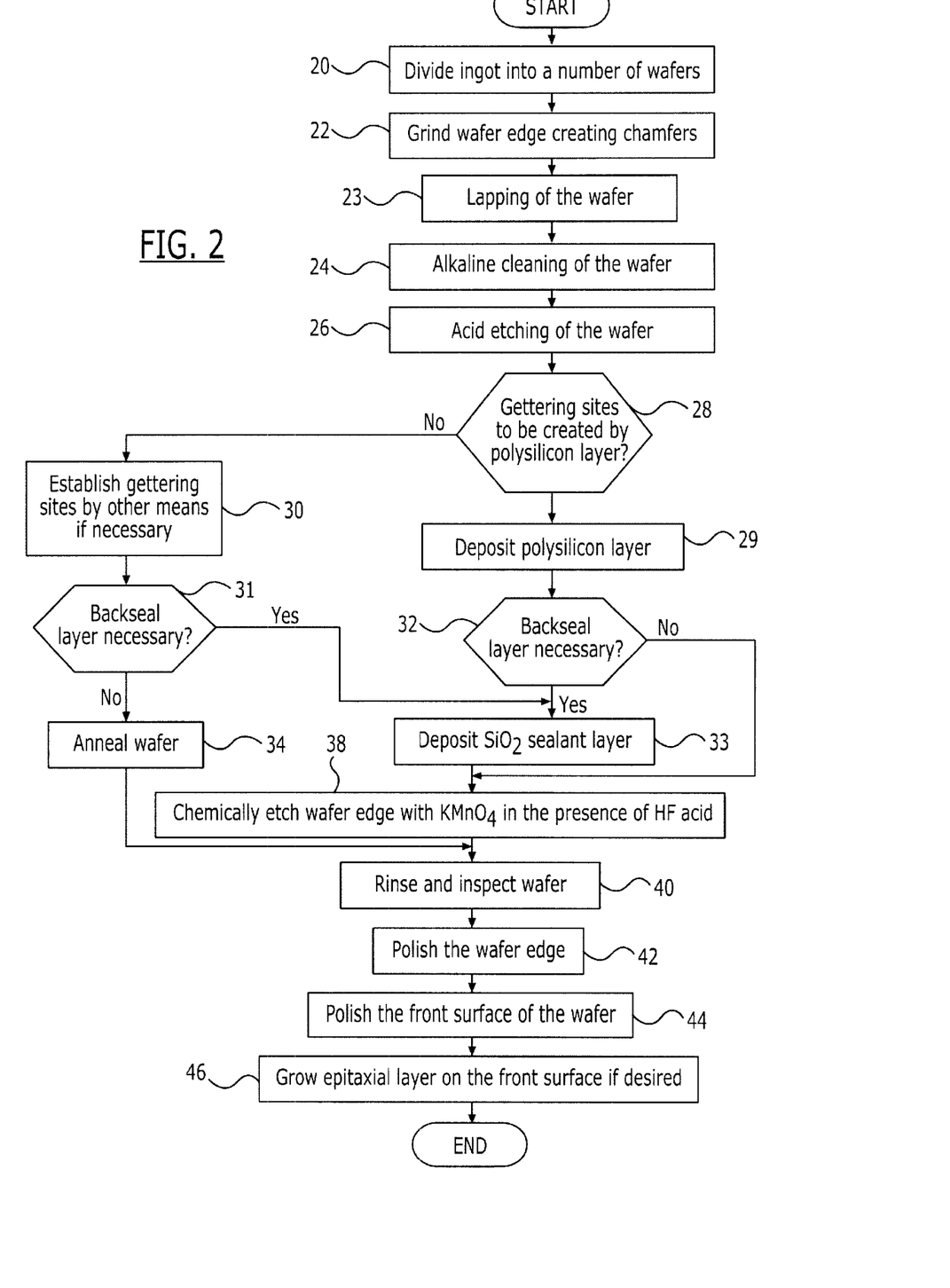
FIG. 2 illustrates a block diagram of the operations performed according to one embodiment of the present invention.

FIG. 2 illustrates the method for fabricating wafers 10, such as silicon wafers, according to one embodiment of the present invention. A crystal ingot is initially drawn from a crucible that contains a host material, such as molten silicon, that has been appropriately doped. As represented by block 20, the ingot is then divided into a plurality of wafers, the edge of one wafer being shown in FIG. 1A. Typically, the crystal ingot is sawed by a diamond-tipped saw to form the ingots.

The peripheral edge of the wafer 10 is then ground, typically by a mechanical grinding process, as depicted in block 22. This grinding process brings the wafer into tolerance with respect to its size or diameter, but also tends to introduce imperfections in the wafer edge with those imperfections being represented as pits 12 in FIG. 1. In addition to sizing the wafers, the mechanical grinding process also shapes the wafer edge. For example, the corners of the wafer edge proximate one or both of the opposed major surfaces can be ground to define a chamfer as shown in FIG. 1B. Although the wafer edge may be shaped in many different ways (e.g., flat, rounded, triangular), a chamfered edge serves to reduce the stress on the wafer edge relative to an unchamfered wafer edge which, in turn, decreases the chance that the wafer will chip and/or crack during subsequent processing operations. Typically, dimensions for $X_1$, $X_2$, and $X_3$, as well as angle a are specified by a customer or industry standards. Although the chamfer can be formed to have various dimensions and angles, dimensions of about 450 $\mu$m, 450 $\mu$m and 350 $\mu$m are common for $X_1$, $X_2$, and $X_3$, respectively, and angles of 11° and 22° are common $\alpha$ angles for wafers.

After the wafer edge has been ground, the wafer 10 is lapped and then is typically subjected to an alkaline cleaning which slightly etches the surface of the wafer. See blocks 23 and 24 of FIG. 2. Although various chemicals can be employed to perform the alkaline cleaning, the wafer is generally placed in a bath of sodium hydroxide (NaOH). Thereafter, the wafer is generally subjected to an acid etching treatment in which a somewhat greater portion of the wafer is removed. See block 26. As described above, however, the alkaline cleaning preferentially etches the wafer edge, thereby potentially enlarging any imperfections 12 created during the edge grinding process, especially along the <100> crystal orientation. See FIG. 1C (in which the increase in the size of the imperfections is enlarged for purposes of illustration). While the acid etching will somewhat reduce the size of the imperfections and begin to smooth the wafer edge, the acid etching does not completely counteract the effects of the alkaline cleaning. See FIG. 1D. In this regard, the average roughness of four wafers was measured following the acid etchings as depicted in Table 1 set forth below. The edge of each wafer was measured at three points designated as 0°, 135° and 270° at which the crystal orientation or direction was <100>, <111> and <100>, respectively. As shown in Table 1, the average surface roughness (Ra) and the root mean square of the surface roughness values (Rms) were obtained for each wafer at each of the three positions. As will be noted, Ra and Rms vary for the same wafer between the <100> and <1 11> orientations due to differences in the etching that occur along the <100> and <111> orientations during the prior alkaline cleaning process.

Thereafter, most wafers 10 are processed to define gettering sites on the back surface. While the back surface can be sand blasted or otherwise roughened to define gettering sites as depicted in block 30 of FIG. 2, the advantages of the present invention are particularly useful in conjunction with wafers that include a polysilicon layer 14 to form the gettering sites. As such, the method of the present invention will subsequently be discussed in conjunction with a wafer on which a polysilicon layer has been deposited, . typically by means of an LPCVD process. See blocks 28 and 29. The polysilicon layer will subsequently serve as a gettering device for attracting bulk impurities, such as transition metals, to the gettering sites established by the polysilicon layer. As such, while the LPCVD process by which the polysilicon layer is deposited effectively deposits polysilicon on all surfaces of the wafer, i.e., the front side, the edge (including within the imperfections 12 to thereby form initiating sites for epitaxial nodules) and the back side of the wafer, the polysilicon layer is subsequently removed from the front surface and the edge of the wafer (including from within the imperfections on the wafer edge) such that the polysilicon layer only remains upon the back surface of the wafer for gettering purposes.

After the polysilicon layer 14 has been deposited per block 29 or after otherwise establishing gettering sites on the back surface of the wafer per block 30, a sealant layer 16 can be deposited upon the backside of the wafer 10, especially if the wafer is p⁺ doped and an epitaxial layer 18 will subsequently be deposited upon the front surface of the wafer. See blocks 31, 32 and 33. As known to those skilled in the art, an epitaxial layer is a relatively thin layer, commonly formed of single crystal silicon, that is grown with a very specifically defined crystal structure and with a very precisely controlled dopant concentration upon the front surface of a wafer in order to facilitate device fabrication. In instances in which an epitaxial layer will later be formed on the front surface of p⁺ doped wafer, a sealant layer, typically formed of $SiO_2$, is preferably deposited on the back surface of the wafer to prevent autodoping. As also known to those skilled in the art, autodoping refers to the process in which dopant escapes from the backside of a p⁺ doped wafer when subjected to the relatively high temperatures at which the epitaxial deposition will take place. Once the dopant escapes through the back surface of the p⁺ doped wafer, the dopant can subsequently be re-deposited upon the front surface, thereby disadvantageously contaminating the resulting epitaxial layer.

If an epitaxial layer 18 is not going to be deposited on the front surface of the wafer 10, a sealant layer 16 is not generally deposited. In addition, a sealant layer is not generally deposited on the back surface of a p-doped wafer since autodoping does not occur, at least not appreciably relative to p⁺ doped wafers. In these instances, the wafer either proceeds immediately to having its edge chemically etched as described hereinbelow in conjunction with block 38 or, if it is determined that the wafer also lacks a polysilicon layer, the wafer is subjected to thermal annealing as depicted in block 34. Thus, wafers that have not previously been subjected to a high temperature processing step, such as the LPCVD process for the deposition of a polysilicon layer 14 or the CVD process for the deposition of a sealant layer 16, are thermally annealed. If, however, an epitaxial layer will subsequently be deposited on the front surface, a sealant layer is typically deposited upon the backside of the wafer by means of a CVD process. Following the edge grinding process and the deposition of a polysilicon layer and any sealant layer, the wafer is typically cleaned.

Figure 3A:
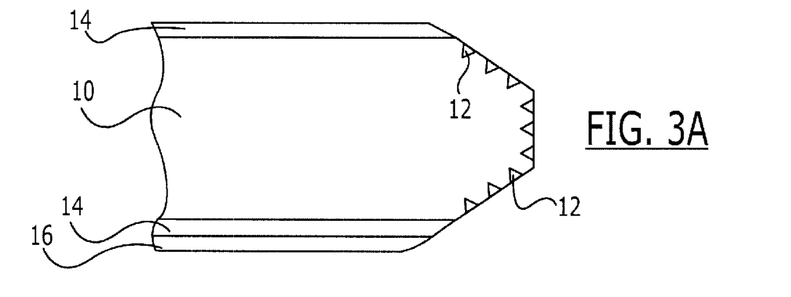
FIGS. 3A, 3B, 3C, 3D are sequential schematic side views of a wafer edge as the wafer is fabricated according to one embodiment of the present invention.

According to the present invention, the wafer edge is also chemically etched, as depicted by block 38, to further smooth the wafer edge. Importantly, the chemical etching process of the present invention etches not only any $SiO_2$ that has been deposited upon the wafer edge during application of the sealant layer 16, but also etches away the polysilicon layer 14 and, if allowed to continue further, into the underlying silicon. As depicted in FIG. 3A, the chemical etching process of the present invention therefore effectively removes the polysilicon layer including the initiating sites while also reducing the overall roughness of the wafer edge by etching the underlying silicon prior to edge polishing. As such, the wafer edge can be subsequently polished in a much quicker and more efficient manner than in conventional processes in which the polysilicon layer must actually be polished off.

Figure 4:
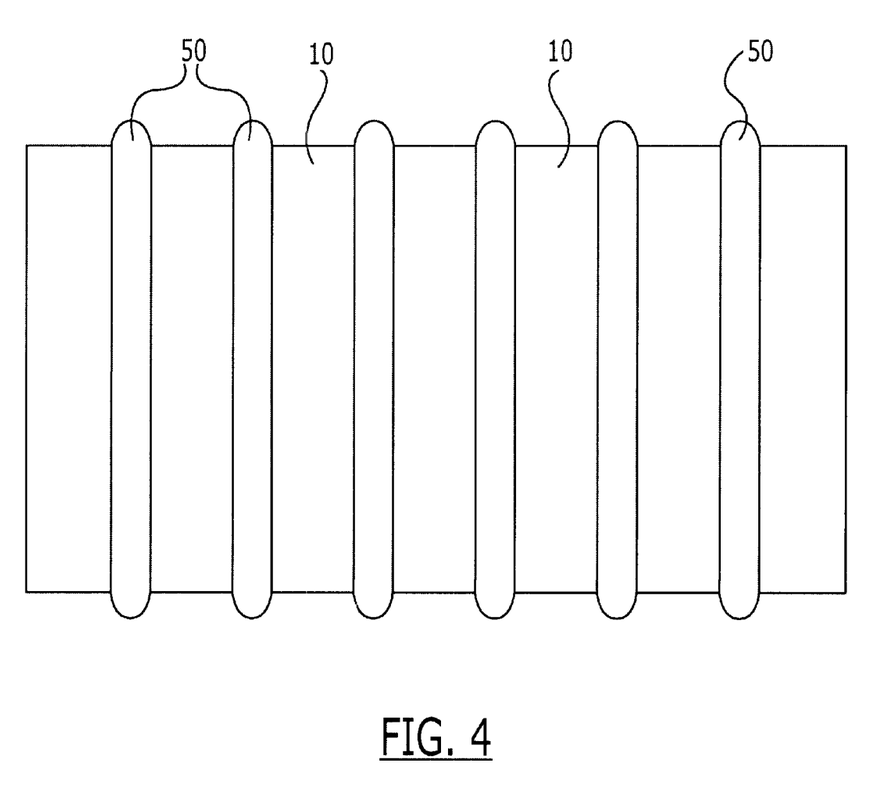
FIG. 4 is a side view of a stack of wafers with interdigitated spacers to facilitate a etching of the wafer edges according to one embodiment of the present invention.

In order to etch the wafer edge without etching the major surfaces, a plurality of wafers 10 are typically stacked such that the major surfaces of the wafers face one another. While any number of wafers can be stacked, a typical stack of wafers includes 25 or more wafers. Spacers 50, typically formed of Teflon™, are generally placed between adjacent wafers so as to cover the major surfaces of the wafers as shown in FIG. 4. Spacers are also typically placed so as to cover the opposed ends of the stack of wafers such that one more spacer is needed than the number of wafers. This stack of wafers is then exposed to the chemical etchant, typically by immersing the stack of wafers in a barrel or other container that is filled with the chemical etchant. It should be noted, however, that the present invention is not limited to this method of exposing the wafers to the chemical etchant. Rather, this method is merely illustrative of one of many known methods of exposing the wafers to a chemical etchant.

Figure 5:
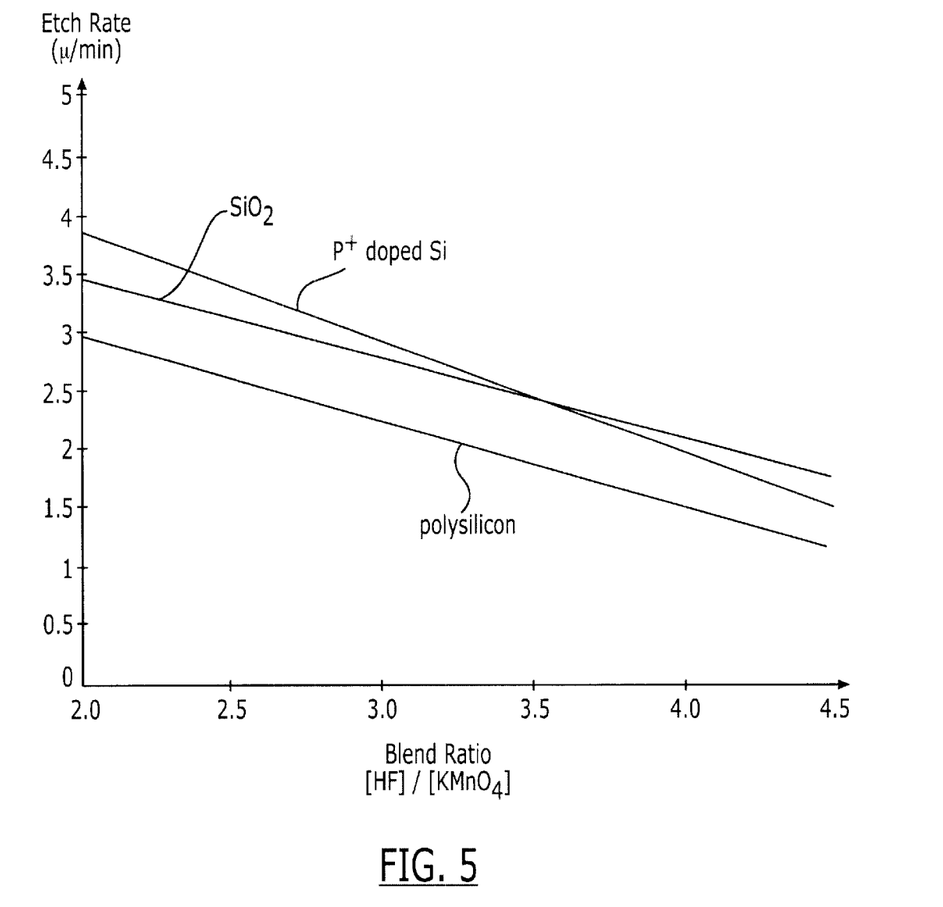
FIG. 5 is a graph depicting the removal rate of p+ doped silicon, polysilicon and $SiO_2$ as a result of exposure to different blend ratios of HF acid to potassium permanganate.

As described above, the chemical etchant known in the art for etching the $SiO_2$ layer deposited upon a wafer edge is HF acid. According to the present invention, however, the chemical etching process uses a potassium-based oxidizer, such as potassium permanganate, in the presence of HF acid as the chemical etchant. In a preferred embodiment, the chemical etchant comprises a solution of HF acid to potassium permanganate in a ratio that varies between 2:1 and 4:1 since volumetric mixtures having a ratio of less than 2:1 will cause a salt to form, while mixtures more dilute than 4:1 will cause the reaction to proceed slowly as depicted in FIG. 5.

During the chemical etching process, the HF acid etches the $SiO_2$ as described above in conjunction with conventional edge etching techniques. According to the present invention, however, the potassium permanganate serves to oxidize the polysilicon layer 14 and a portion of the underlying silicon for removal by the HF acid. As such, the potassium-based chemical etchant in the presence of HF acid not only removes the $SiO_2$ and polysilicon layers, but also etches a few microns of the underlying bare silicon, thereby smoothing the wafer edge prior to the edge polishing process. See FIG. 3A.

The rate at which the $SiO_2$, the polysilicon and the underlying silicon are etched depends upon the blend ratio of the HF acid to the potassium-based chemical oxidizer, such as potassium permanganate. As shown in FIG. 5, for example, while the etch rates of silicon dioxide, polysilicon and $p^+$ doped silicon, i.e., the substrate, vary somewhat, each of the etch rates decreases as the ratio of HF acid to potassium permanganate increases. Typically, for example, the etch rates vary between about 1.5 microns per minute and 4 microns per minute with the polysilicon generally being etched at a slower rate than either the $SiO_2$ or the $p^+$ doped silicon.

Regardless of the ratio of HF acid to potassium permanganate, the potassium-based chemical oxidizer in the presence of HF acid removes the polysilicon, including the polysilicon deposited within the imperfections 12 created during the edge grinding process that would otherwise form initiating sites. In addition, the potassium permanganate in the presence of HF acid etches a few microns of the bare silicon that underlies the polysilicon layer 14, thereby reducing the surface roughness of the wafer edge. In this regard, Table 1 set forth below depicts the results of roughness measurements of four wafers, as measured by a Chapman MP2000 non-contact surface polishing system available from Chapman Instruments of Rochester, N.Y., at three different positions about the edge of the wafers designated 0°, 135° and 270° and having corresponding crystal orientations of <100>, <111> and <100>, respectively, for wafers subjected to chemical etching in which the concentration of HF acid to potassium permanganate varies from 2:1 to 4:1 and the etching time varies from 40 seconds to 110 seconds.

along there orientations that occur during the prior alkaline cleaning process, Thus, not only does the chemical etchant of the present invention effectively remove $SiO_2$ and polysilicon, including the polysilicon within the imperfections 12 in the wafer edge that would otherwise form initiating sites, but the chemical etchant also smoothes the wafer edge prior to the edge polishing process.

Figure 3B:
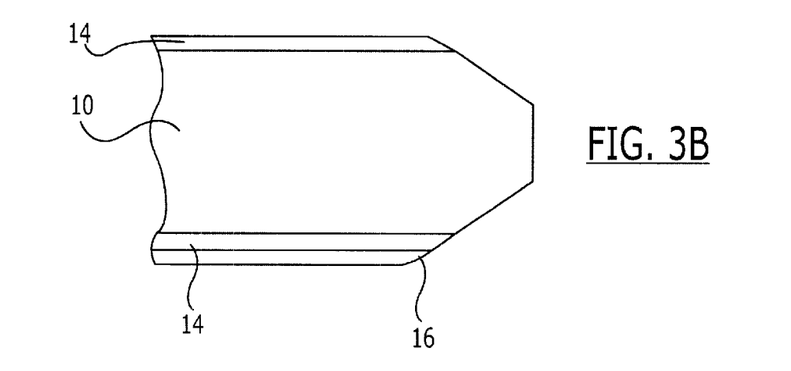

After the etching process, as depicted in block 40, the wafer 10 is rinsed, typically with deionized water, to remove any excess chemical etchant. Following inspection, the wafer edge is polished, as shown by block 42, typically by means of an edge polishing machine that applies one or more slurries, such that the resulting edge surfaces have almost a mirrored finish. See FIG. 3B. Edge polishing results in a smooth mirror-like surface that resists the subsequent adhesion of contaminants. Since the chemical etchant has removed the polysilicon including the polysilicon initiating sites from the wafer edge and has already smoothed the wafer edge to some extent, the edge polishing process can be performed much more quickly and efficiently than conventional edge polishing which had to first polish away the polysilicon layer 14 prior to beginning to actually smooth the wafer edge. By polishing the wafer edge in a quicker, more efficient manner, the throughput of the wafer fabrication process can be advantageously increased.

Once the wafer edge has been ground, etched, and polished, as described above, the front surface of the wafer 10 can be polished as depicted by block 44, usually by means of a polishing machine that also sequentially employs slurries that have particulates of different sizes in order to finely polish the front surface. Among other things, the polishing of the front surface removes the polysilicon layer from the front surface and smoothes the underlying silicon

TABLE 1

| Wafer number | Concentration of HF to $KMnO_4$ | Etching time (sec) | Measurement angle | Orientation | Following Acid Etch Ra | Following Acid Etch Rms | Following etch with $KMnO_4$ Ra | Following etch with $KMnO_4$ Rms | Rms Surface roughness reduction | % |
|---|---|---|---|---|---|---|---|---|---|---|
| 1 | [2:1] | 40 | 0° | <100> | 345.67 | 445.95 | 261.08 | 349.8 | 96.15 | 21.56% |
|   |       |    | 135° | <111> | 302.08 | 393.66 | 154.28 | 198.36 | 195.3 | 49.61% |
|   |       |    | 270° | <100> | 304.68 | 450.23 | 170.79 | 226.43 | 223.8 | 49.71% |
| 2 | [2.75:1] | 56 | 0° | <100> | 321.51 | 469.54 | 155.01 | 207.84 | 261.7 | 55.74% |
|   |       |    | 135° | <111> | 261.03 | 337.89 | 126.18 | 159.22 | 178.67 | 52.88% |
|   |       |    | 270° | <100> | 323.18 | 437.88 | 237.08 | 370.45 | 67.43 | 15.40% |
| 3 | [3:1] | 82.5 | 0° | <100> | 352.54 | 453.2 | 202.3 | 257.75 | 195.45 | 43.13% |
|   |       |    | 135° | <111> | 269.89 | 359.39 | 118.81 | 153.65 | 205.74 | 57.25% |
|   |       |    | 270° | <100> | 294.59 | 382.71 | 278.72 | 347.39 | 35.32 | 9.23% |
| 4 | [4:1] | 110 | 0° | <100> | 423.09 | 559.61 | 252.34 | 321.93 | 237.68 | 42.47% |
|   |       |    | 135° | <111> | 293.61 | 368.25 | 180.2 | 216.96 | 151.29 | 41.08% |
|   |       |    | 270° | <100> | 289.94 | 357.58 | 218.93 | 288.32 | 69.26 | 19.37% |

Average % <100> 32.08%
Average % <111> 52.05%

Figure 3C:
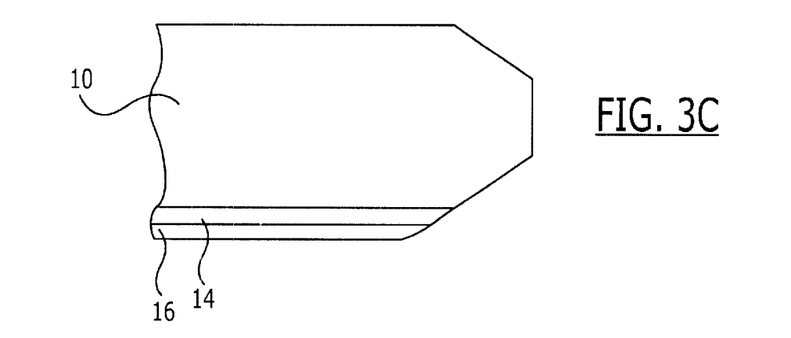
Figure 3D:
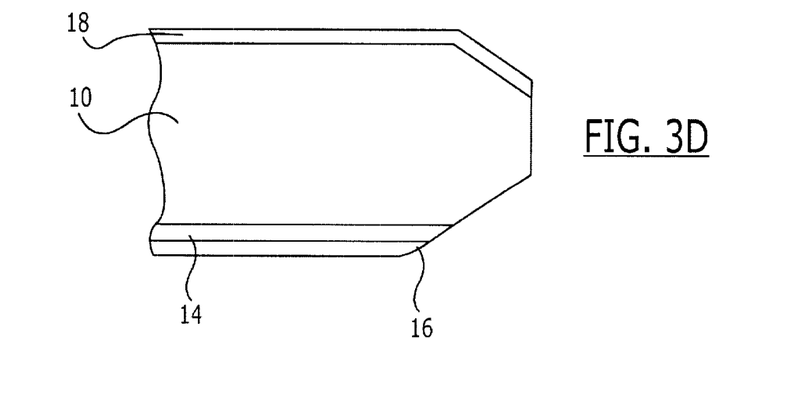

As shown, the average surface roughness (Ra) and the root mean square values (Rims) for the surface roughness improve substantially following the chemical etching relative to the surface roughness of the wafer 10 following acid etching that is described hereinabove and is depicted as block 26 in FIG. 2. In this regard, Table 1 indicates the magnitude of the RMS surface roughness reduction as well as the percentage decrease of the RMS surface roughness reduction. Overall, the average percentage decrease for silicon crystal having a <100> orientation is 32.08% and for silicon crystal having a <111> orientation is 52.05% with the difference between the results for the <100> and <111> orientations being attributable to differences in the etching surface. See FIG. 3C. After the front surface has been polished, the wafer may optionally have an epitaxial layer 18 grown thereon, as depicted by block 46 and in FIG. 3D. Since the chemical etching of the present invention has removed the polysilicon, including the polysilicon initiating sites that would otherwise lead to nodules, from the wafer edge, the resulting epitaxial layer does not suffer from the misorientation created by conventional wafers that included polysilicon nodules of indeterminate orientation on the wafer edge. Thereafter, the wafer can be shipped for further fabrication of semiconductor devices thereupon.

According to the present invention, the method therefore controllably etches the edge of a wafer 10 with a potassium-based chemical oxidizer in the presence of HF to remove polysilicon, including polysilicon deposited within imperfections that would otherwise form initiating sites, thereby preventing the polysilicon nodules from forming on the edge portions of any subsequently deposited epitaxial layer. In addition, the potassium-based chemical oxidizer in the presence of HF acid also smoothes the edge of the wafer in advance of the edge polishing process such that the edge polishing process will proceed more efficiently and quickly.

Many modifications and other embodiments of the invention will come to mind to one skilled in the art to which this invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. A method for fabricating a wafer, comprising:
   grinding an edge of the wafer to have a shape;
   depositing a polysilicon layer on the wafer including at least one major surface of the wafer and the edge of the wafer;
   etching the ground edge of the wafer with a potassium-based chemical oxidizer in the presence of hydrofluoric acid to remove at least the polysilicon layer from the edge of the wafer without removing the polysilicon layer from the at least one major surface of the wafer; and
   polishing the etched edge of the wafer.

2. The method of claim 1 wherein said etching comprises etching the edge of the wafer with potassium permanganate in the presence of hydrofluoric acid.

3. The method of claim 1 wherein said etching comprises etching the edge of the wafer with the potassium-based chemical oxidizer in the presence of hydrofluoric acid with a removal rate of between 1.5 microns/minute and 4 microns/minute.

4. The method of claim 1 wherein said etching comprises etching the edge of the wafer with the potassium-based chemical oxidizer in the presence of hydrofluoric acid having a ratio of hydrofluoric acid to potassium-based chemical oxidizer of between 2:1 and 4:1.

5. The method of claim 1 further comprising depositing a silicon dioxide layer on at least portions of the wafer following the deposition of the polysilicon layer, wherein said etching also removes the silicon dioxide layer from the edge of the wafer.

6. The method of claim 1 further comprising cleaning the wafer with an alkaline solution between said grinding and etching steps.

7. The method of claim 1 further comprising etching the wafer with an acidic solution between said grinding and etching steps.

8. A method for chemically etching an edge of a wafer comprising:
   depositing a polysilicon layer on the wafer including at least one major surface of the wafer and the edge of the wafer;
   covering opposed major surfaces of the wafer to thereby protect the major surfaces; and
   exposing the edge of the wafer to a potassium-based chemical oxidizer in the presence of hydrofluoric acid while the opposed major surfaces are covered to thereby etch the edge of the wafer so as to remove at least the polysilicon layer from the edge of the wafer without removing the polysilicon layer from the at least one major surface of the wafer.

9. The method of claim 8 wherein exposing comprises etching the edge of the wafer with potassium permanganate in the presence of hydrofluoric acid.

10. The method of claim 8 wherein said exposing comprises etching the edge of the wafer with the potassium-based chemical oxidizer in the presence of hydrofluoric acid with a removal rate of between 1.5 microns/minute and 4 microns/minute.

11. The method of claim 8 wherein said exposing comprises etching the edge of the wafer with the potassium-based chemical oxidizer in the presence of hydrofluoric acid having a ratio of hydrofluoric acid to potassium-based chemical oxidizer of between 2:1 and 4:1.

12. The method of claim 8 further comprising depositing a silicon dioxide layer on at least portions of the wafer following the deposition of the polysilicon layer, wherein said exposing also removes the silicon dioxide layer from the edge of the wafer.

13. The method of claim 8 further comprising cleaning the wafer with an alkaline solution prior to said exposing step.

14. The method of claim 9 further comprising etching the wafer with an acidic solution prior to said exposing step.

15. The method of claim 8 wherein said covering comprises stacking a plurality of wafers such that the major surface of one wafer faces the major surface of another wafer.

16. The method of claim 15 wherein stacking comprises inserting a spacer between adjacent wafers such that the major surfaces of the adjacent wafers contact the spacer which covers the major surfaces.

17. A method for fabricating wafers comprising:
    dividing a crystal ingot into a plurality of wafers;
    grinding an edge of at least one wafer to have a shape;
    depositing a polysilicon layer on the wafer including at least one major surface of the wafer and the edge of the wafer following said grinding step;
    etching the edge of the wafer with a potassium permnanganate in the presence of hydrofluoric acid to thereby remove the polysilicon layer from the edge of the wafer without removing the polysilicon layer from the at least one major surface of the wafer, wherein the ratio of hydrofluoric acid to potassium permanganate is between 2:1 and 4:1;
    rinsing the wafer following etching; and
    thermally annealing the wafer following rinsing.

18. The method of claim 17 further comprising depositing a silicon dioxide layer on at least portions of the wafer following the deposition of the polysilicon layer, wherein said etching also removes the silicon dioxide layer from the edge of the wafer.

19. The method of claim 17 further comprising polishing the edge of the wafer following thermal annealing.

* * * * *

UNITED STATES PATENT AND TRADEMARK OFFICE
CERTIFICATE OF CORRECTION

PATENT NO. : 6,482,749 B1
DATED : November 19, 2002
INVENTOR(S) : Billington et al.

It is certified that error appears in the above-identified patent and that said Letters Patent is hereby corrected as shown below:

Title page,
Item [56], References Cited, OTHER PUBLICATIONS,
"Proecess" should read -- Process --.

Column 10,
Line 30, "claim 9" should read -- claim 8 --;
Lines 46-47, "permnanganate" should read -- permanganate --.

Signed and Sealed this

Eighth Day of April, 2003

JAMES E. ROGAN
*Director of the United States Patent and Trademark Office*